(12) United States Patent
Hofmann et al.

(10) Patent No.: US 6,639,269 B1
(45) Date of Patent: Oct. 28, 2003

(54) ELECTRICALLY PROGRAMMABLE MEMORY CELL CONFIGURATION AND METHOD FOR FABRICATING IT

(75) Inventors: Franz Hofmann, München (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 77 days.

(21) Appl. No.: 09/648,952

(22) Filed: Aug. 25, 2000

Related U.S. Application Data

(63) Continuation of application No. PCT/DE99/00417, filed on Feb. 15, 1999.

(30) Foreign Application Priority Data

Feb. 27, 1998 (DE) .......................................... 198 08 527

(51) Int. Cl.$^7$ ................... H01L 21/8247; H01L 29/788
(52) U.S. Cl. ................... 257/316; 257/321; 438/259
(58) Field of Search ................ 438/257–267; 257/316, 321

(56) References Cited

U.S. PATENT DOCUMENTS

| | | | |
|---|---|---|---|
| 4,979,004 A | 12/1990 | Esquivel et al. | |
| 5,392,237 A | 2/1995 | Iida | |
| 5,486,714 A | 1/1996 | Hong | |
| 5,567,635 A | 10/1996 | Acovic et al. | |
| 5,705,415 A | * 1/1998 | Orlowski et al. | |
| 6,239,465 B1 | * 5/2001 | Nakagawa | 257/331 |
| 6,303,439 B1 | * 10/2001 | Lee et al. | 438/259 |

FOREIGN PATENT DOCUMENTS

| | | |
|---|---|---|
| EP | 0 562 307 A2 | 9/1993 |
| JP | 1-115164 | 5/1989 |

OTHER PUBLICATIONS

Japanese Patent Abstract No. 04164372 (Hiroto), dated Jun. 10, 1992.
Japanese Patent Abstract No. 02310971 (Noriaki), dated Dec. 26, 1990.
Published International Application No. WO 97/36332 (Dormans et al.), dated Oct. 2, 1997.

* cited by examiner

*Primary Examiner*—Richard Booth
(74) *Attorney, Agent, or Firm*—Laurence A. Greenberg; Werner H. Stemer; Ralph E. Locher

(57) ABSTRACT

A memory cell contains a planar transistor whose channel region is disposed at a bottom of a depression in a substrate. A floating gate electrode of the transistor adjoins the bottom of the depression, the bottom being provided with a first dielectric disposed on sidewalls of the depression. Since the floating gate electrode has a larger area than the channel region, a capacitance formed by a control gate electrode applied on the floating gate electrode and the floating gate electrode is greater than a capacitance formed by the floating gate electrode and the channel region. Two source/drain regions of the transistor likewise adjoin the sidewalls of the depression. An insulation, which is thicker than the first dielectric, isolates the floating gate electrode from the source/drain regions, so that the source/drain regions do not contribute to the coupling ratio.

17 Claims, 6 Drawing Sheets

US 6,639,269 B1

ELECTRICALLY PROGRAMMABLE MEMORY CELL CONFIGURATION AND METHOD FOR FABRICATING IT

CROSS-REFERENCE TO RELATED APPLICATION

This is a continuation of copending International Application PCT/DE99/00417, filed Feb. 15, 1999, which designated the United States.

BACKGROUND OF THE INVENTION

Field of the Invention

The invention relates to an electrically programmable memory cell configuration and a method for fabricating it.

In semiconductor-based electrically programmable memories, so-called EEPROMs, information is stored in the form of at least two different threshold voltages of transistors. In order to read out an item of information of one of the transistors, a voltage lying between the two threshold voltages is applied to a control gate electrode of the transistor. The logic values 0 or 1 are read out depending on whether or not a current flows through the transistor.

The threshold voltage of the transistor can be set by a floating gate electrode, which is electrically insulated and is disposed between the control gate electrode and a channel region of the transistor. To that end, a voltage drop is produced between the control gate electrode and the channel region or a source/drain region of the transistor, which causes electrons to tunnel into or out of the floating gate electrode. A different charge of the floating gate electrode results in different threshold voltages of the transistor.

The name of the floating gate electrode stems from the fact that the electrode is not connected to a potential, i.e. it "floats". The name of the control gate electrode stems from the fact that the electrode both controls the programming and serves for reading out the information.

In VLSI technology endeavors are made to increase the packing density of circuit configurations in order to reduce process costs and increase circuit speeds.

In order to avoid short-channel effects in the case of a high packing density, U.S. Pat. No. 5,486,714 proposes an electrically programmable memory cell configuration in which source/drain regions of a transistor which acts as memory cell are disposed on upper parts of two mutually opposite sidewalls of a depression. A channel region of the transistor is U-shaped and runs along the two sidewalls and along a bottom of the depression. A large channel length is obtained by this configuration in the case of a high packing density. A floating gate electrode adjoins four sidewalls and the bottom of the depression. The depression is provided with a thermally grown gate oxide in the region of the channel region. In order to reduce the capacitance formed by the floating gate electrode and the channel region, the gate oxide is somewhat thicker on the two sidewalls of the depression than on the bottom of the depression. When information is erased, electrons tunnel only at the bottom of the depression. Disposed above the floating gate electrode is a control gate electrode, which is isolated from the floating gate electrode by a second dielectric. The control gate electrode is part of a word line running perpendicularly to a connecting line between the source/drain regions. The floating gate electrode overlaps the surface of the substrate outside the depression. One of the source/drain regions is connected to a bit line via a contact. The fact that only a very small read current is available, on account of the in some parts thick gate oxide, is disadvantageous.

A further memory cell configuration is described in U.S. Pat. No. 5,392,237. In this case, the floating gate electrode is likewise disposed in a depression and adjoins four sidewalls of the depression. Insulating structures are disposed on the two sidewalls on which the source/drain regions are not disposed. The gate oxide has a uniform thickness. The source region contains a first part and a second part. The first part is disposed underneath the second part and has a lower dopant concentration than the second part. The first part adjoins the channel region. The first part and the second part adjoin a sidewall of the depression.

U.S. Pat. No. 5,567,635 describes an electrically fen programmable memory cell configuration in which a memory cell contains a MOS-FET, a floating gate electrode and a control gate electrode. The floating gate electrode is disposed on four sidewalls and a bottom of a depression. Two source/drain regions of the MOS-FET adjoin two mutually opposite sidewalls of the depression. Insulating structures adjoin the remaining two sidewalls of the depression. A channel region is disposed at the bottom of the depression. The MOS-FET is a planar transistor. The floating gate electrode is electrically insulated from the MOS-FET by a first dielectric. The first dielectric is thinner on the two sidewalls adjoined by the source/drain regions than on the bottom of the depression. Electrons tunnel only at the two sidewalls of the depression. The floating gate electrode acts as gate electrode of the MOSFET. The control gate electrode is part of a word line running parallel to a connecting line between the two source/drain regions. Japanese Patent JP 1-115164 describes an electrically programmable memory cell configuration in which source/drain regions of a transistor adjoin sidewalls of a depression. The sidewalls and a bottom of the depression are provided with a first dielectric. Adjoining the first dielectric is a floating gate electrode on which a second dielectric and a control gate electrode are disposed. During the writing and art reading of information, electrons tunnel at upper and at lower edges of the depression between the floating gate electrode and the source/drain regions of the transistor.

A coupling ratio is the ratio between a capacitance formed by a control gate electrode and a floating gate electrode and a capacitance formed by the floating gate electrode and a channel region and also source/drain regions of a transistor, that is to say by the floating gate electrode and the substrate. The coupling ratio should be as large as possible in order that tunneling can be triggered even at low operating voltages.

SUMMARY OF THE INVENTION

It is accordingly an object of the invention to provide an electrically programmable memory cell configuration and a method for fabricating it which overcome the above-mentioned disadvantages of the prior art devices and methods of this general type, which has a large coupling ratio in comparison with the prior art and can nevertheless be fabricated with a high packing density.

With the foregoing and other objects in view there is provided, in accordance with the invention, an electrically programmable memory cell configuration. The memory cell configuration includes a substrate having a surface and depressions each with a bottom and mutually opposite sidewalls formed therein. A plurality of memory cells having planar it transistors are disposed in the substrate and each of the memory cells has a planar transistor. The planar transistor has two source/drain regions adjoining two of the sidewalls of the depression. A channel region is disposed in the substrate at least part of the bottom of the depression. A first dielectric is disposed on the bottom of the depression in a region of the channel region, the channel region has a cross section that is parallel to the surface of the substrate and intersects the two source/drain regions. A floating gate electrode adjoins the first dielectric and is partially disposed on at least two of the mutually opposite sidewalls of the depression and the depression is constricted but not filled by the floating gate electrode. A second dielectric layer is provided. A control gate electrode is disposed above the floating gate electrode and is insulated from the floating gate electrode by the second dielectric. An insulation layer is disposed on two of the sidewalls of the depression for preventing a capacitance between the two source/drain regions and the floating gate electrode, and parts of the floating gate electrode disposed on the two of the sidewalls of the depression adjoin the insulation layer.

In an electrically programmable memory cell configuration according to the invention, the substrate contains memory cells each having a planar transistor. The channel region of the transistor is disposed in the substrate at at least part of the bottom of the depression that is provided with the first dielectric. The channel region preferably adjoins the entire bottom of the depression. The bottom of the depression is provided with the first dielectric in the region of the channel region. Two source/drain regions of the transistor adjoin the channel region, a cross section through the channel region, the cross section being parallel to the surface of the substrate, intersecting the two source/drain regions. The cross section runs in the vicinity of the bottom of the depression. Parts of the two source/drain regions are thus disposed at the same level as the channel region. The floating gate electrode of the transistor adjoins the first dielectric and is partially disposed on at least two mutually opposite sidewalls of the depression. The depression is constricted but not filled by the floating gate electrode. The control gate electrode is disposed above the floating gate electrode and is insulated from the floating gate electrode by the second dielectric. The control gate electrode is electrically connected to a word line. The thickness of the first dielectric is dimensioned in such a way that electrons can tunnel through the memory cell during the programming and during the erasure of the memory cell. The source/drain regions adjoin the two sidewalls of the depression. The two source/drain regions thus reach from the surface of the substrate as far as a region of the bottom of the depression. The two sidewalls of the depression are provided with insulation in order to avoid a capacitance formed by the floating gate electrode and the source/drain regions. The thickness of the insulation is dimensioned at least such that, during programming, electrons do not tunnel through the insulation into or out of the floating gate electrode.

A capacitance formed by the control gate electrode and the floating gate electrode is greater than a capacitance formed by the floating gate electrode and the channel region since the floating gate electrode, in contrast to the channel region, is also disposed on at least two sidewalls of the depression. Consequently, an area between the control gate electrode and the floating gate electrode is larger than an area between the channel region and the floating gate electrode. The capacitance between the floating gate electrode and the source/drain regions is negligible. The source/drain regions do not contribute to the coupling ratio.

The coupling ratio is consequently large. Since the enlargement is in the vertical direction, a high packing density can be realized.

In order to simplify the process and in order to increase the packing density, it is advantageous if the control gate electrodes form word lines.

The depression may be produced in the substrate or in a layer in disposed on the substrate. It may also be produced partially in a layer and in the substrate.

The insulation is in spacer form, for example, and may be produced by insulating material being deposited and etched back. The thickness of the insulation is e.g. 30 nm.

In order to make the fabrication as compatible as possible with the fabrication of conventional planar transistors, it is advantageous if the depression is produced in the substrate.

In order to avoid a capacitance formed by the word line and a respective one of the two source/drain regions, the two source/drain regions are preferably disposed in such a way that no connecting line between them is parallel to the course of the word line and the current flow between them runs transversely with respect to the word line. In other words, the word line runs essentially parallel to lines of intersection which are formed by the surface of the substrate and the two sidewalls of the depression. For the same reason, it is advantageous if the word line does not overlap the two source/drain regions i.e. is disposed between the two source/drain regions.

The two source/drain regions may be produced by implantation of the surface of the substrate. As an alternative, a layer grown epitaxially in situ is produced as part of the substrate and patterned. A further possibility is for dopant from a dopant source to diffuse into the substrate.

The depression may be a trench whose length is greater than its width. In this case, a plurality of floating gate electrodes of different transistors are disposed in the trench.

In order to increase the capacitance between the control gate electrode and the floating gate electrode, it is advantageous if the depression is hole-like and has e.g. two further sidewalls that the floating gate electrode likewise adjoins. This enlarges even-more the area between the floating gate electrode and the control gate electrode in comparison with the area between the floating gate electrode and the channel region. The coupling ratio is increased.

In order to prevent a channel current from forming between the source/drain regions of different transistors, the regions being adjacent along the word line, on account of the word line, it is advantageous to dispose first insulating structures between depressions that are adjacent along the word line. In this case, the depression is disposed between two of the first insulating structures that form the two further sidewalls of the depression. The word line overlaps the first insulating structures and a connecting line between the two first insulating structures runs parallel to it.

The first insulating structures may be produced for example by trenches that run essentially parallel to one another being produced before the depression is produced, the trenches being filled with insulating material. The first insulating structures fill the trenches. The depressions can then be produced between the trenches by masked etching. In order to ensure that the two further sidewalls of the depression are formed by the first insulating structures, it is advantageous if a strip-type mask is used during the masked etching, the strips of which mask run transversely with respect to the trenches. As an alternative, the mask does not cover only those regions of the substrate in which the depressions are produced.

Another possibility for producing the first insulating structures is to produce the depressions by partial removal of the insulating material in the trenches. The first insulating structures are in the form of pillars in this case.

The floating gate electrode is produced by patterning of a conductive first layer that constricts, but does not fill, the depression.

It is advantageous if the floating gate electrode does not project appreciably from the depression. In this case, in order to pattern the conductive first layer, the conductive first layer may be planarized until parts of the conductive first layer which are situated outside the depression have been removed. In this way, a mask is not required for producing the floating gate electrode, which simplifies the process. In order to planarize the conductive first layer, planarization material may be deposited, which is planarized at the same time as the conductive first layer. After the parts of the conductive first layer that are situated outside the depression have been removed, remaining planarization material can be removed.

In order to avoid short-channel effects, it is advantageous if the two source/drain regions each contain a first part and a second part adjoining the latter. First parts of the two source/drain regions are each disposed on one of the two sidewalls of the depression and such that they adjoin the channel region, and have a lower dopant concentration than second parts of the source/drain regions which adjoin neither the sidewalls of the depression nor the channel region.

The second parts of the source/drain regions may be produced by implantation with the aid of a mask. In order to simplify the process, it is advantageous if the mask contains the word line and adjoining spacers along the word line. The spacers can be produced without a high outlay by material being deposited and etched back after the word line has been produced.

The spacers can be removed or left. If the spacers are left, then it is advantageous if the spacers are produced from insulating material, since a capacitance between the word line and the two source/drain regions is avoided as a result of this.

In order to make the fabrication as compatible as possible with the fabrication of conventional planar transistors, it is advantageous if the first parts of the two source/drain regions are produced by implantation, the word line serving as a mask. In this case, the spacers are not produced until after the first parts of the two source/drain regions have been produced.

The first parts of the source/drain regions may also be produced before the depression is produced. By way of example, they are produced from a doped layer of the substrate that is patterned by the depression and the first insulating structures.

A bit line runs transversely with respect to the word line. Transistors that are adjacent along the bit line may be connected in series (NAND architecture) or in parallel (NOR architecture). If the transistors are connected in series, then they form the bit line. If the transistors are connected in parallel with one another, then a source/drain region of the transistors is in each case connected to the bit line. The connection is effected via a contact, for example.

In both cases, it is advantageous for the purpose of increasing the packing density if two of the transistors which are adjacent to one another along the bit line in each case have a common source/drain region.

It is advantageous if a periphery of the memory cell configuration that contains the planar transistors and/or planar high-voltage transistors is disposed in the substrate.

High-voltage transistors are operated with high voltages, e.g. 18 volts, and require large channel lengths. The high-voltage transistors switch e.g. programming voltages that are higher than the read voltage. They serve for the writing or erasure of the memory cells.

In order to simplify the process, it is advantageous if the planar transistors and the planar high-voltage transistors of the periphery are produced at the same time as the transistors of the memory cells.

With the foregoing and other objects in view there is further provided, in accordance with the invention, a method for fabricating an electrically programmable memory cell configuration, which includes providing a substrate. A depression having a bottom and sidewalls is produced in the substrate. A first dielectric is disposed at least partially at the bottom of the depression. A channel region of a planar transistor of a memory cell is produced in the substrate, the channel region adjoins the first dielectric. Two source/drain regions of the planar transistor are formed by implantation of a surface of the substrate such that the two source/drain regions adjoin two mutually opposite sidewalls of the depression. A cross section through the channel region is parallel to the surface of the substrate, and intersects the two source/drain regions. An insulation is applied to the two mutually opposite sidewalls of the depression. A conductive layer is applied to the depression resulting in the depression being constricted, but not filled, by the conductive layer. The conductive layer is then patterned thus forming a floating gate electrode of the planar transistor. The floating gate electrode adjoins the first dielectric and the insulation, the insulation prevents a formation of a capacitance between the floating gate electrode and the two source/drain regions. A second dielectric layer is formed above the floating gate electrode, and a control gate electrode is formed above the second dielectric layer.

By way of example, the first insulating structures may be produced together with second insulating structures of the transistors of the periphery and with third insulating structures of the high-voltage transistors of the periphery.

The second insulating structures each surround one of the transistors of the periphery. The third insulating structures each surround one of the high-voltage transistors of the periphery.

Furthermore, after the production of a gate dielectric of the transistor of the periphery and of a gate dielectric of the high-voltage transistor of the periphery, a second layer may be applied and patterned, thereby simultaneously producing the control gate electrode as part of the word line, a gate electrode of the transistor of the periphery and a gate electrode of the high-voltage transistor of the periphery.

The first parts of the two source/drain regions of the of the memory cell, first parts of source/drain regions of the transistor of the periphery and first parts of source/drain regions of the high-voltage transistor of the periphery can be produced simultaneously by implantation, the word line, the gate electrode of the transistor of the periphery and the gate electrode of the high-voltage transistor of the periphery acting as masks, as is customary in the conventional method for producing planar transistors. All first parts of the source/drain regions are doped more weakly than second parts of the source/drain regions. The first parts adjoin associated channel regions, as a result of which short-channel effects are suppressed.

The second parts of the two source/drain regions of the transistor of the memory cell, second parts of the source/drain regions of the transistor of the periphery and second parts of the source/drain regions of the high-voltage transistor of the periphery can be produced simultaneously. The spacers and further spacers which are produced at the same time as the spacers on sidewalls of the gate electrode of the transistor of the periphery and of the gate electrode of the high-voltage transistor of the periphery acting as a mask.

Since short-channel effects are particularly critical in the case of the high-voltage transistor, it is advantageous to use here an e.g. web-type mask which covers the gate electrode of the high-voltage transistor, the associated spacers and a surrounding region-so that the first parts of the source/drain regions of the high-voltage transistor are made particularly large.

The transistor of the memory cell, the transistor of the periphery and the high-voltage transistor of the periphery may be n-channel or p-channel transistors.

In accordance with an added feature of the invention, a connecting line is produced between the two source/drain regions. A word line is produced such that it is electrically connected to the control gate electrode and that the connecting line between the two source/drain regions is not parallel to a course of the word line.

In accordance with an additional feature of the invention, first insulating structures are produced in the substrate. The depression is then formed between two of the first insulating structures. The first insulating structures form two of the sidewalls of the depression, and the floating gate electrode is patterned such that it also adjoins the first insulating structures and thus at least four of the sidewalls of the depression.

In accordance with another feature of the invention, after the conductive layer has been applied, a planarization material is deposited and planarized until parts of the conductive layer situated outside the depression are uncovered. The planarization of the parts of the conductive layer situated outside of the depression continues until the parts are removed, the floating gate electrode which does not project out from the depression thereby being produced.

In accordance with another added feature of the invention, a first part of each of the two source/drain regions is produced. The first part adjoins one of the two mutually opposite sidewalls of the depression and the channel region. After the word line has been produced, a material is deposited and etched back for producing spacers along sidewalls of the word line. A second part of each of the two source/drain regions is produced by implantation with an aid of the spacers being used as a mask, the second part being doped more heavily than the first part and adjoins the first part.

In accordance with another additional feature of the invention, the planar transistor is one of a plurality of planar transistors-produced in a plurality of depressions, and each two of the planar transistors which are adjacent to one another transversely with respect to the word line share a common source/drain region. A bit line is formed by series-connecting the planar transistors that are adjacent to one another transversely with respect to the word line.

In accordance with a further feature of the invention, the planar transistor is one of a plurality of transistors produced in a plurality of depressions, and each two of the planar transistors which are adjacent to one another transversely with respect to the word line share a common source/drain region. A bit line is produced connected to a respective source/drain regions of each of the planar transistors which are adjacent to one another transversely with respect to the word line.

In accordance with a concomitant feature of the invention, at least one second insulating structure of a further planar transistor of a periphery of the memory cell configuration and a third insulating structure of a planar high-voltage transistor of the periphery are produced in the substrate together with the first insulating structures. Before the control gate electrode is produced, a gate dielectric of the further planar transistor of the periphery and a gate dielectric of the planar high-voltage transistor of the periphery are produced. A further layer is applied and patterned thereby producing the control gate electrode that is part of a word line, a gate electrode of the further planar transistor of the periphery and a gate electrode of the planar high-voltage transistor of the periphery. First parts of the two source/drain regions of the planar transistor of the memory cell, first parts of source/drain regions of the further planar transistor of the periphery, and first parts of source/ drain regions of the planar high-voltage transistor of the periphery are produced by implantation. The word line, the gate electrode of the further planar transistor of the periphery and the gate electrode of the planar high-voltage transistor of the periphery act as masks. A material for producing spacers along sidewalls of the word line is deposited and etched back. Further spacers are formed on sidewalls of the gate electrode of the further planar transistor of the periphery. Finally, second parts of the two source/drain regions of the planar transistor of the memory cell, second parts of the source/drain regions of the further planar transistor of the periphery and second parts of the source/drain regions of the planar high-voltage transistor of the periphery are produced, where at least the spacers and the further spacers act as a mask.

One possible method of operation of the electrically programmable memory cells according to the invention is described below.

In the case of the NOR architecture, in order to write the logic value "1" to a transistor, the associated word line is connected to a voltage of −12 volts and the associated bit line is connected to a voltage of 5 volts. The remaining word lines and the remaining bit lines are at 0 volts. On account of the voltage drop between the word line, i.e. the control gate electrode of the transistor, and the bit line, i.e. a source/drain region of the transistor, electrons tunnel through the first dielectric from the floating gate electrode into the source/drain region. During erasure, a voltage of 0 volts is present on the bit line, while the word line is connected to 17 volts, with the result that electrons can tunnel from the channel region into the floating gate electrode. This corresponds to the logic value 0.

In the case of the NAND architecture, the transistor is programmed by a voltage of 17 volts being applied to the word line, while the bit line remains at 0 volts. To ensure that transistors which are adjacent along the word line are not likewise programmed, the adjacent bit lines can be connected to a voltage of approximately 8 volts. Erasure can be effected by the word lines being connected to 0 volts, while the channel region is connected to approximately 16 volts via the well.

In order to read out the information of the transistor, in the case of the NOR architecture, the associated word line is connected to a voltage of approximately 2.5 volts which lies between the two possible threshold voltages of the transistor, corresponding to the logic values 0 or 1. By the bit line, an evaluation is made as to whether or not a current flows through the transistor.

In the case of the NAND architecture, in order to read out the ES information of the transistor, the word line is connected to approximately 2.5 volts, while the remaining word lines are connected to approximately 5 volts.

An evaluation is then made as to whether or not a current flows in the case of approximately 5 volts on the bit line.

Other features which are considered as characteristic for the invention are set forth in the appended claims.

Although the invention is illustrated and described herein as embodied in an electrically programmable memory cell configuration and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1b is a fragmented, cross-sectional view through the substrate in a region of a periphery of the memory cell configuration after the process steps shown in FIG. 1a;

FIG. 1c is a fragmented, cross-sectional view through the substrate in the region of the periphery after the process steps shown in FIG. 1a;

FIG. 4b is a fragmented, cross-sectional view of a detail from FIG. 1b after the process steps shown in FIG. 4a;

FIG. 4c is a fragmented, cross-sectional view of a detail from FIG. 1c after the process steps shown in FIG. 4a;

FIG. 5b is a fragmented, cross-sectional view of a detail from FIG. 4b after the process steps shown in FIG. 5a;

FIG. 5d is a fragmented, cross-sectional view through the substrate, the cross section being perpendicular to the cross section from FIG. 5a, after the process steps shown in FIG. 5a;

FIG. 6b is a fragmented, cross-sectional view of FIG. 5b after the process steps shown in FIG. 6a;

FIG. 6c is a fragmented, cross-sectional view of the cross section from FIG. 5c after the process steps shown in FIG. 6a;

DESCRIPTION OF THE PREFERRED EMBODIMENTS

Figure 1A:
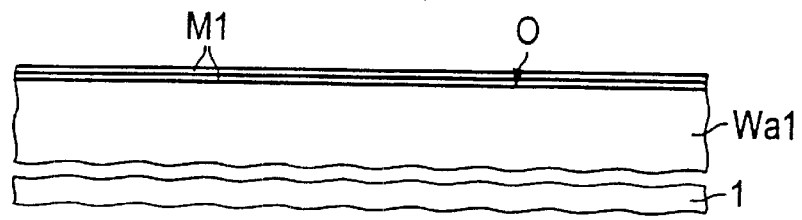
FIG. 1a is a diagrammatic, fragmented, cross-sectional view through a substrate in a region of memory cells after a first mask, first insulating structures (illustrated in FIG. 5d), a second insulating structure (illustrated in FIG. 1b), a third insulating structure (illustrated in FIG. 1c), a first well, a second well and a third well have been produced according to the invention.
Figure 1B:
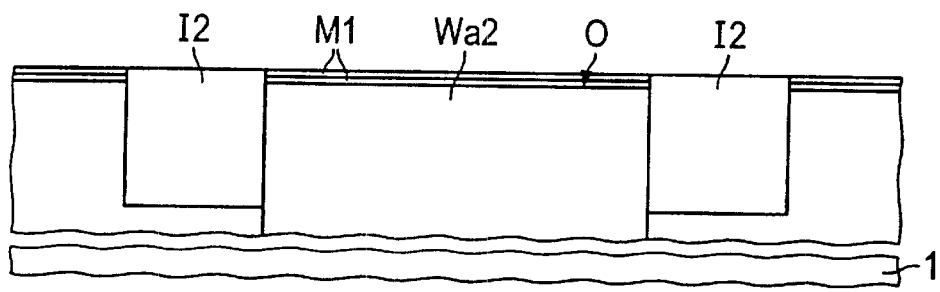
Figure 1C:
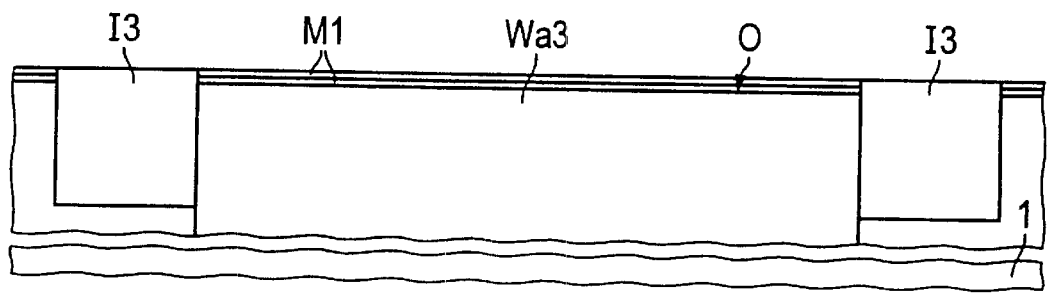

In all the figures of the drawing, sub-features and integral parts that correspond to one another bear the same reference symbol in each case. Referring now to the figures of the drawing in detail and first, particularly, to FIG. 1a thereof, there are shown a p-doped substrate 1 made of silicon. In order to produce a first mask M1, $SiO_2$ is deposited to a thickness of approximately 20 nm and, over that, a silicon nitride is deposited to a thickness of approximately 40 nm and patterned by a photolithographic method in such a way that the first mask M1, in a first region, does not cover elongate rectangular regions and, in a second region, does not cover a region around a transistor—to be produced—of a periphery of a memory cell configuration and a region around a high-voltage transistor—to be produced—of the periphery. The silicon 1 is etched to a depth of approximately 250 nm with the aid of the first mask M1. A suitable etchant is HBr, for example. Deposition of $SiO_2$ to a thickness of approximately 300 nm and subsequent chemical mechanical polishing until the first mask M1 is uncovered produce first insulating structures I1 (see FIG. 5d) in the first region, a second insulating structure I2 (see FIG. 1b), and a third insulating structure I3 (see FIG. 1c) in the second region. The first insulating structures I1 which are adjacent along a y-axis Y running in a surface 0 of the substrate 1 are at a distance of approximately 200 nm from one another in the direction of the y-axis Y. A dimension of the first insulating structures I1 that is parallel to the y-axis Y amounts to approximately 200 nm. The first insulating structures I1 which are adjacent along an x-axis X running in the surface 0 and perpendicularly to the y-axis Y are at a distance of approximately 200 nm from one another. A dimension of the first insulating structures I1 that is parallel to the x-axis X amounts to approximately 3200 nm. End points of the first insulating structures I1 which are adjacent along the y-axis Y are disposed along a line parallel to the y-axis Y. End points of the first insulating structures I1 that are adjacent along the x-axis X are disposed along a line parallel to the x-axis X.

By masked implantations with p-doping ions, a first well Wa1 having a depth of approximately 400 nm is produced in the first region. A second well Wa2 having a depth of approximately 200 nm and a third well Wa3 having a depth of approximately 200 nm are produced in the second region. The second well Wa2 is surrounded by the second insulating structure I2, and the third well Wa3 is surrounded by the third insulating structure I3 (see FIGS. 1a, 1b, 1c). The dopant concentration of the first well Wa1, of the second well Wa2 and of the third well Wa3 is approximately $10^{17}$ cm$^{-3}$.

With the aid of a second mask (not illustrated), whose strips run parallel to the y-axis Y, depressions V having a depth of approximately 200 nm are produced in the first region of the substrate 1 between the first insulating structures I1. A suitable etchant is HBr, for example. Two of the sidewalls of each depression V adjoin two mutually adjacent first insulating structures I1. A dimension of the depressions V which is parallel to the x-axis X amounts to approximately 200 nm. Depressions V which are adjacent parallel to the x-axis X are at a distance of approximately 200 nm (see FIG. 2).

In order to remove etching residues, a sacrificial oxide (not illustrated) having a thickness of approximately 10 nm is grown thermally and subsequently removed again using e.g. HF.

Figure 2:
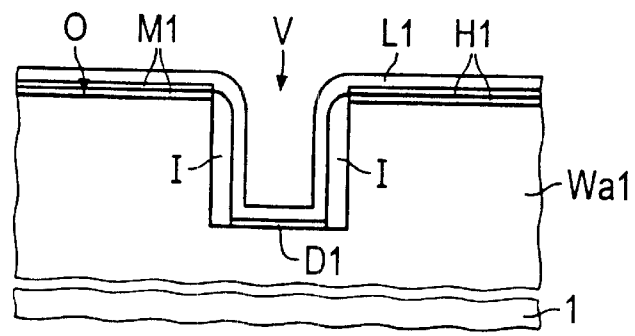
FIG. 2 is a fragmented, cross-sectional view of a detail from FIG. 1a after depressions, insulation, a first dielectric and a conductive first layer have been produced.

In order to produce insulation I on sidewalls of the depressions V, SiO$_2$ is deposited to a thickness of approximately 30 nm, using a TEOS method, and etched back until the first mask M1 is uncovered (see FIG. 2). The a insulation I is in spacer form and has a thickness of approximately 30 nm.

A first dielectric D1, which has a thickness of approximately 8 nm and acts as tunnel oxide, is subsequently produced by thermal oxidation on bottoms of the depressions V (see FIG. 2).

A conductive first layer L1 having a thickness of approximately 20 nm is produced by the deposition of polysilicon doped in situ (see FIG. 2).

Planarization resist is subsequently deposited to a thickness of approximately 500 nm and planarized by chemical mechanical polishing until the conductive first layer L1 is partially uncovered. The conductive first layer L1, together with the planarization resist, is subsequently subjected to chemical mechanical polishing until the first mask M1 is uncovered.

Figure 3:
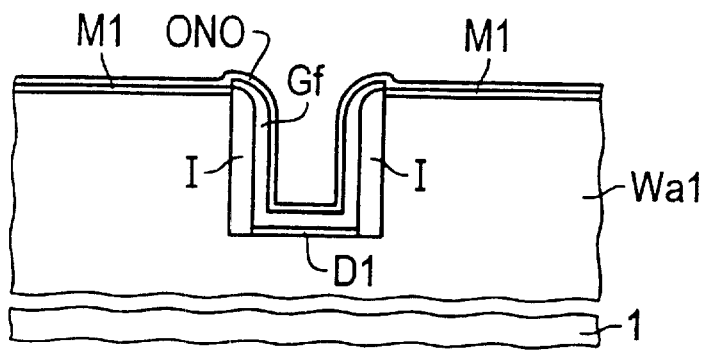
FIG. 3 is a fragmented, cross-sectional view of a detail from FIG. 2 after a floating gate electrode and an ONO layer have been produced.

Parts of the conductive first layer L1 which lie outside the depression V are thereby removed. Remaining parts of the conductive first layer L1 cover the four sidewalls and the bottom of each depression V and form floating gate electrodes Gf of transistors of memory cells (see FIG. 3). Remaining parts of the planarization resist are removed. Silicon nitride of the first mask M1 is removed using e.g. phosphoric acid.

In order to produce an ONO layer ONO, firstly thermal SiO$_2$ having a thickness of approximately 3 nm is grown. Silicon nitride is subsequently deposited to a thickness of approximately 10 nm and oxidized until an oxide-equivalent thickness of approximately 15 nm is produced. This results in a three-part ONO layer ONO in which silicon nitride is disposed between oxides (see FIG. 3). A photolithographic method is used to remove the ONO layer ONO in the second region of the substrate 1. A suitable etchant is HF, for example. The first mask M1 is subsequently removed in the second region of the substrate 1. A suitable etchant is HF, for example.

Figure 4A:
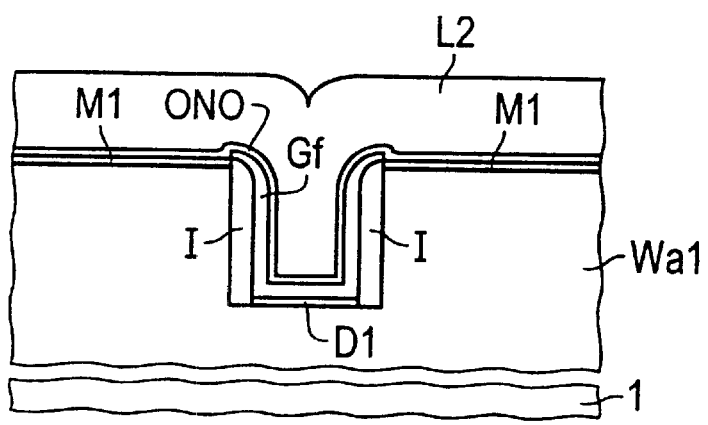
FIG. 4a is a fragmented, cross-sectional view of a detail from FIG. 3 after the ONO layer and a first mask have been removed in the region of the periphery and a gate dielectric of a transistor of the periphery, a gate dielectric of a high-voltage transistor of the periphery and a second layer have been produced.
Figure 4B:
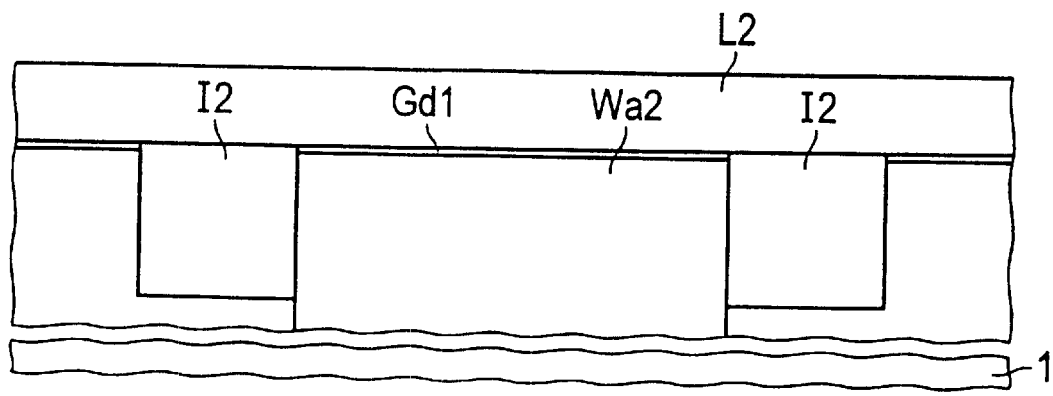
Figure 4C:
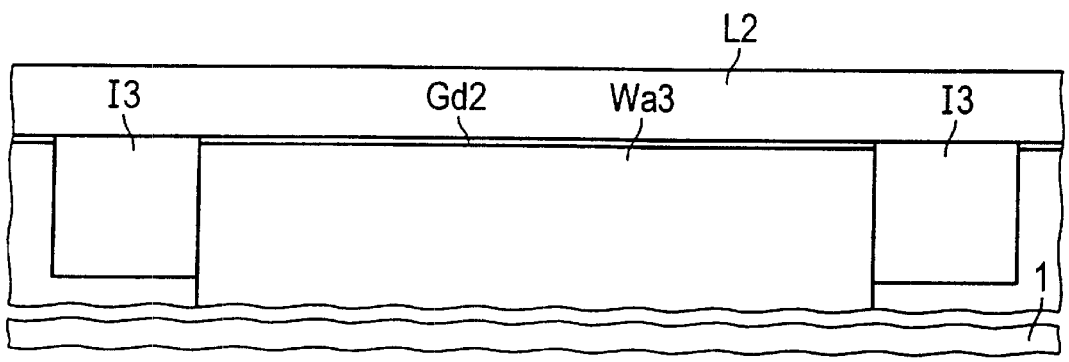

SiO$_2$ is grown to a thickness of approximately 25 nm by thermal oxidation. This produces a gate dielectric Gd2 of the high-voltage transistor of the periphery on the region surrounded by the third insulating structure I3. By a photolithographic method, SiO$_2$ is removed by isotropic etching using HF, for example, in the region surrounded by the second insulating structure I2. SiO$_2$ is subsequently grown, by thermal oxidation, to a thickness of approximately 7 nm in the region enclosed by the second insulating structure I2, thereby producing a gate dielectric Gd1 of the transistor of the periphery. In this case, the gate dielectric Gd2 of the high-voltage transistor of the periphery becomes somewhat thicker (see FIGS. 4b and 4c). In order to produce a second layer L2, undoped polysilicon is deposited to a thickness of approximately 100 nm (see FIGS. 4a, b, c).

With the aid of a third mask (not illustrated), which is in strip form in the first region of the substrate 1 and whose strips run parallel to the y-axis Y and cover the depressions V, the second layer L2 is etched using HBr, for example, in a highly selective manner with respect to SiO$_2$, the ONO layer ONO acting as an etching stop. In this case, control gate electrodes Gk are produced from the second layer L2, which electrodes form word lines running parallel to the y-axis Y.

Figure 5A:
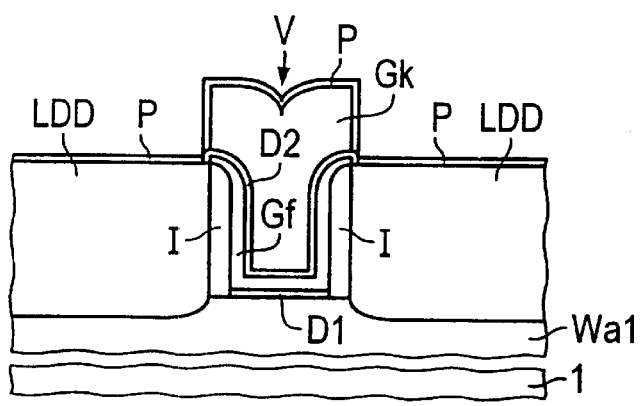
FIG. 5a is a fragmented, cross-sectional view of a detail from FIG. 4a after a control gate electrode, a gate electrode of the transistor of the periphery, a gate electrode of the high-voltage transistor of the periphery, first parts of source/drain regions of transistors of the memory cells, first parts of source/drain regions of the transistor of the periphery, first parts of the source/drain regions of the high-voltage transistor of the periphery and a post-oxide have been produced.

With the aid of the third mask, the ONO layer ONO is patterned using e.g. HF (see FIG. 5a). In this case, second dielectrics D2 are produced from the ONO layer ONO (see FIG. 5d). A gate electrode Ga1 of the transistor of the periphery and a gate electrode Ga2 of the high-voltage transistor of the periphery are likewise produced with the aid of the third mask (see FIGS. 5b and c).

Figure 5B:
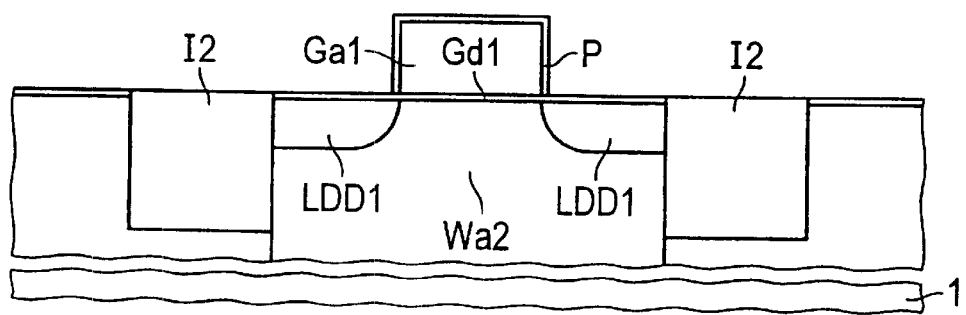
Figure 5C:
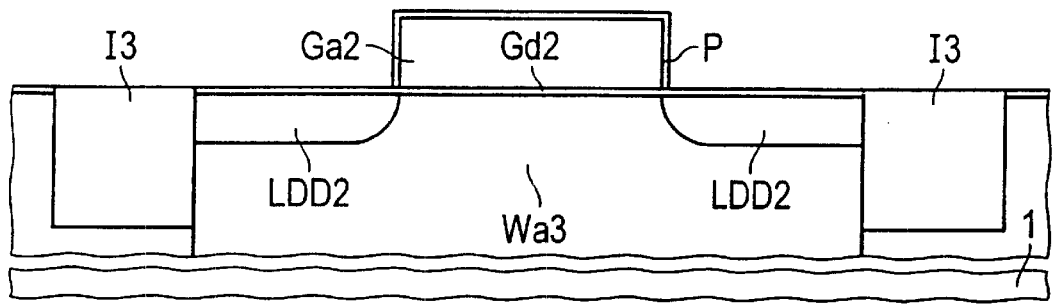
FIG. 5c is a fragmented, cross-sectional view of a detail from FIG. 4c after the process steps shown in FIG. 4c.
Figure 5D:
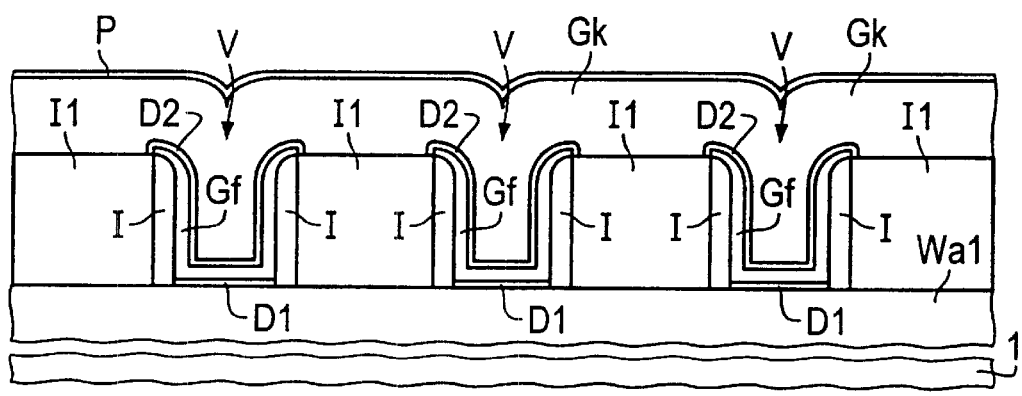

In order to reduce inter alia the risk of short circuits between word lines and the substrate 1, a so-called post-oxide P is grown by thermal oxidation (see FIGS. 5a, 5b, 5c).

First parts LDD, having a depth of approximately 200 nm, of source/drain regions S/D of the transistors of the memory cells, first parts LDD1, having a depth of approximately 100 nm, of source/drain regions S/D1 of the transistor of the periphery and first parts LDD2, having a depth of approximately 100 nm, of source/drain regions S/D2 of the high-voltage transistor of the periphery are subsequently produced by masked implantations with n-doping ions (see FIGS. 5a, 5b, 5c). The word lines, the gate electrode Ga1 of the transistor of the periphery and the gate electrode Ga2 of the high-voltage transistor of the periphery serve as mask and are implanted in the process. In order to protect regions of the substrate 1 that are not shown in the figures against implantation, a photoresist mask may additionally be used.

The dopant concentration of the first parts LDD of the source/drain regions S/D of the transistors of the memory cells, of the first parts LDD1 of the source/drain regions S/D1 of the transistor of the periphery and of the first parts LDD2 of the source/drain regions S/D2 of the high-voltage transistor of the periphery is approximately $10^{18}$ cm$^{-3}$. The first parts LDD, LDD1, LDD2 are thus produced in a self-aligned manner with respect to the word lines, the gate electrode Ga1 of the transistor of the periphery and the gate electrode Ga2 of the high-voltage transistor of the periphery. The first parts LDD of the source/drain regions S/D of the transistors of the memory cells each adjoin one of two mutually opposite sidewalls of the depressions V and reach as far as a region of the bottoms of the depressions V.

Figure 6A:
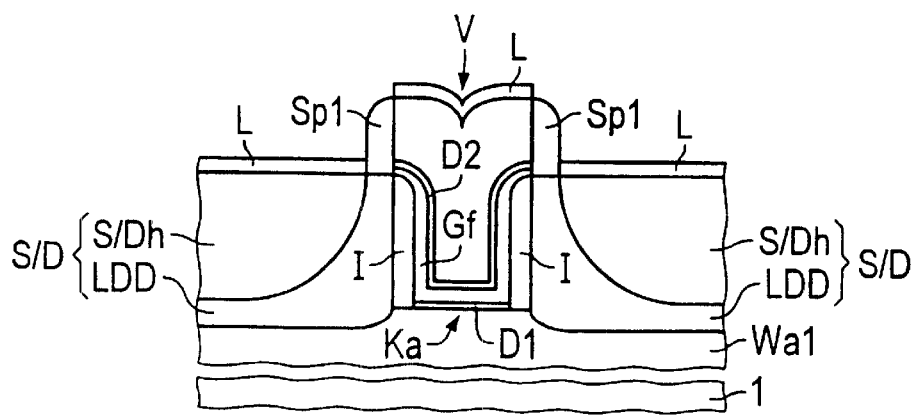
FIG. 6a is a fragmented, cross-sectional view of a detail from FIG. 5a after first spacers, second spacers, third spacers, second parts of the source/drain regions, second parts of the source/drain regions of the transistor of the periphery, second parts of the high-voltage transistor of the periphery, conductive structures, conductive structures of the transistor of the periphery, and conductive structures of the high-voltage transistor of the periphery have been produced, furthermore, the position of a web made of photoresist which has been removed before the production of the conductive structures is illustrated.
Figure 6B:
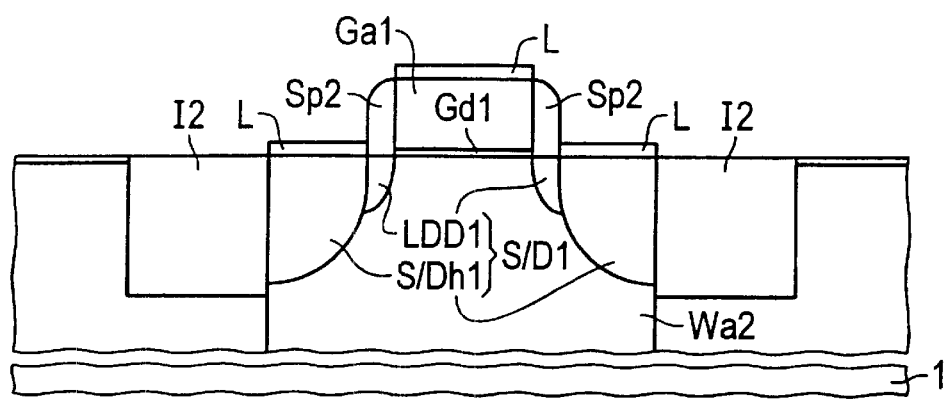

In order to produce first spacers Sp1, second spacers Sp2 and third spacers Sp3, SiO$_2$ is deposited to a thickness of approximately 50 nm and etched back. This produces the first spacers Sp1 along sidewalls of the word lines (see FIG. 6a), the second spacers Sp2 along sidewalls of the gate electrode Ga1 of the transistor of the periphery and the third spacers Sp3 along sidewalls of the gate electrode Ga2 of the high-voltage transistor of the periphery (see FIGS. 6a, 6b, 6c). Since the post-oxide P is partially etched away during the etching-back process, approximately 10 nm of SiO$_2$ are deposited using a TEOS method in order to produce a screen oxide (not illustrated).

Figure 6C:
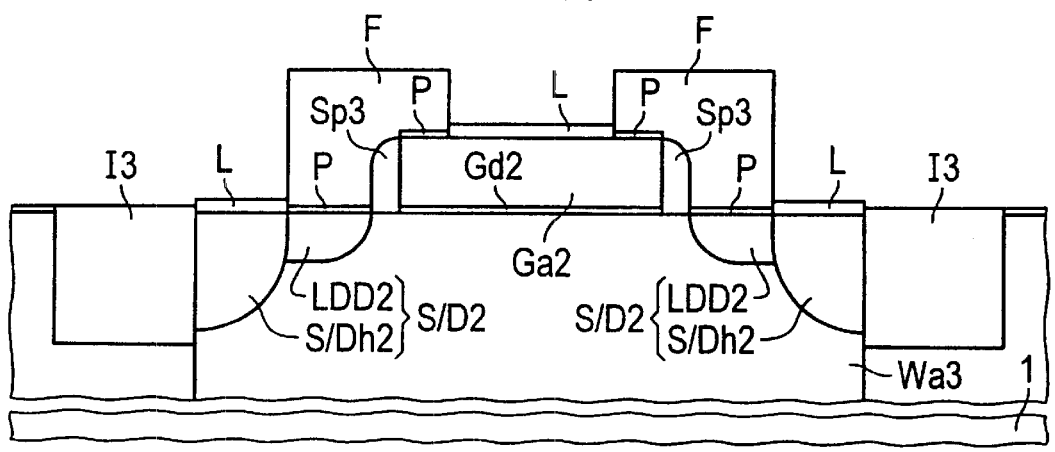

A web made of photoresist F is subsequently produced which overlaps the edges of the gate electrode Ga2 of the high-voltage transistor and also covers a region surrounding them (see FIG. 6c).

Second parts S/Dh, having a depth of approximately 150 nm, of the source/drain regions S/D of the transistors of the memory cells, second parts S/Dh1, having a depth of approximately 150 nm, of the source/drain regions S/D1 of the transistor of the periphery and second parts S/Dh2, having a depth of approximately 150 nm, of the source/drain regions S/D2 of the high-voltage transistor of the periphery are produced by implantation with n-doping ions. In this case, the first spacers Sp1, the word lines, the second spacers Sp2, the gate electrode Ga1 of the transistor of the periphery and the web made of photoresist F serve as a mask. The second parts S/Dh of the source/drain regions S/D of the transistors of the memory cells and the second parts S/Dh1 of the source/drain regions S/D1 of the transistor of the periphery are thus produced in a self-aligned manner (see FIGS. 6a, 6b, 6c). The screen oxide and parts of the post-oxide P which are not covered by the web made of photoresist F are removed using HF, for example. The web made of photoresist F is removed.

Titanium is subsequently deposited to a thickness of approximately 30 nm. Selective siliconization is carried out by heat treatment, as a result of which the source/drain regions S/D of the transistors of the memory cells, the source/drain regions S/D1 of the transistor of the periphery and parts of the source/drain regions S/D2 of the high-voltage transistor of the periphery which are not covered by the post-oxide P, the word lines, the gate electrode Ga1 of the transistor of the periphery and parts of the gate electrode Ga2 of the high-voltage transistor of the periphery which are not covered by the post-oxide P are provided with conductive structures L (see FIGS. 6a, 6b, 6c). Remaining titanium is removed using $H_2O_2/NH_3$, for example.

The first region of the substrate 1 is the region of the memory cells and the second region is the region of the periphery of the memory cell configuration.

Figure 7A:
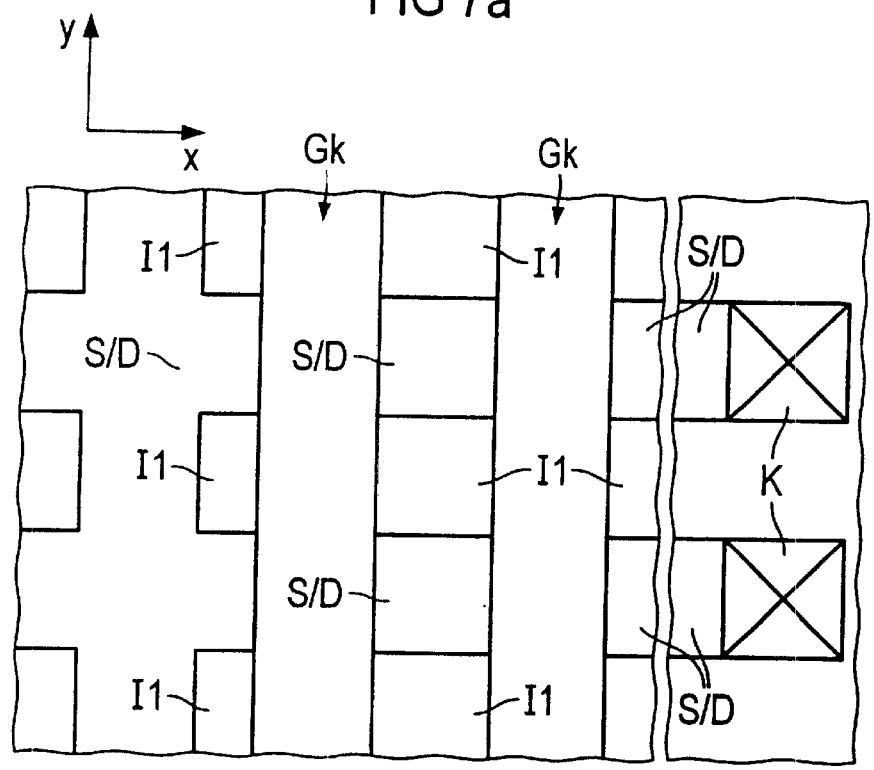
FIG. 7a is a fragmented, plan view of the memory cell configuration in a NAND architecture.

The memory cells are combined in blocks. Two first insulating structures I1 that are adjacent along the x-axis X belong to different blocks. A source/drain region (S/D) of transistors which are adjacent along the x-axis X is provided with a bit line contact K. Eight transistors of the memory cells which are adjacent along the x-axis X are assigned to one of the blocks, are connected in series and form parts of bit lines (see FIG. 7a).

Each memory cell of the fabricated memory cell configuration contains a planar transistor whose channel region Ka is formed at the bottom of one of the depressions V. No connecting line between two source/drain regions S/D of the transistor runs parallel to the y-axis Y and to the course of the word line. The current flow of the transistor runs parallel to the x-axis X. Transistors which are adjacent perpendicularly to the y-axis Y share a common source/drain region S/D.

There are many conceivable variations of the exemplary embodiments that likewise lie within the scope of the invention. In particular, the dimensions of the described layers, depressions, masks, spacers and structures can be adapted as desired to the respective requirements. The same also applies to the dopant concentrations proposed.

Moreover, the transistors of the memory cells which are adjacent along the x-axis X, are connected in series and form parts of bit lines-can be assigned to a block in a number other than eight, e.g. sixteen. In this case, that dimension of the first insulating structure that is parallel to the x-axis X is adapted in such a way that the transistors adjoin it.

Figure 7B:
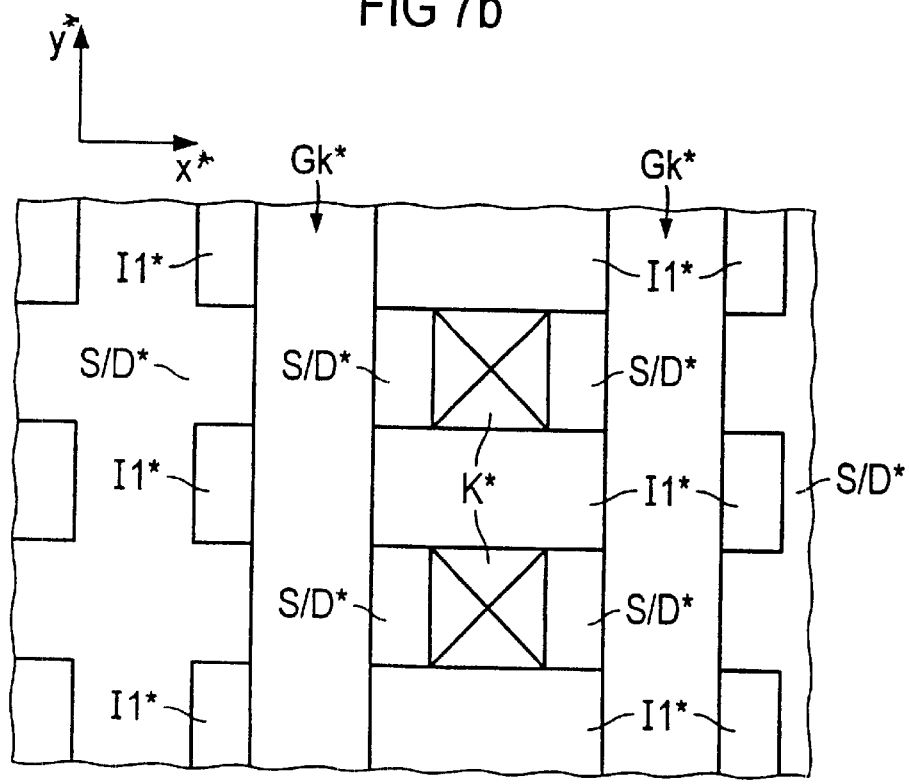
FIG. 7b is a fragmented, plan view of the memory cell configuration in a NOR architecture.

By slightly altering the exemplary embodiment, it is possible to fabricate an electrically programmable memory cell configuration in which the transistors which are adjacent along the y-axis Y* are connected in parallel with one another. To that end, the bit lines are produced which are connected via contacts K* to a respective source/drain region S/D* of each transistor (see FIG. 7b). Dimensions of the first insulating structures I1* which are parallel to the x-axis X* amount to e.g. 1000 nm if a common source/drain region S/D* of transistors which are adjacent along the y-axis Y* is disposed between first insulating structures I1* which are adjacent along the x-axis X* and the adjacent transistors are axially symmetrical with respect to one another with regard to the y-axis Y*.

We claim:

1. An electrically programmable memory cell configuration, comprising:

a substrate having a surface and depressions each with a bottom and mutually opposite sidewalls formed therein;

a plurality of memory cells having planar transistors, each of said memory cells having a planar transistor disposed in said substrate, said planar transistor having:

two source/drain regions adjoining two of said sidewalls of said depression and extending from said surface of said substrate to said bottom of said depression;

a channel region disposed in said substrate in at least part of said bottom of said depression;

a first dielectric layer disposed on said bottom of said depression in a region of said channel region, said dielectric layer having a thickness allowing tunneling of electrons during programming, said channel region having a cross section being parallel to said surface of said substrate and intersects said two source/drain regions;

a floating gate electrode adjoining said first dielectric and partially disposed on at least two of said mutually opposite sidewalls of said depression and said depression being constricted but not filled by said floating gate electrode;

a second dielectric layer;

a control gate electrode disposed above said floating gate electrode and insulated from said floating gate electrode by said second dielectric; and an insulation spacer disposed on two of said sidewalls of said depression and extending from said surface of said substrate to said bottom of said depression for preventing a capacitance between said two source/drain regions and said floating gate electrode, said insulation spacer having a thickness eliminating tunneling during programming, said first dielectric layer extending from said insulation spacer of at least one of said sidewalls to the other of said sidewalls on said bottom of said depression, and parts of said floating gate electrode disposed on said two of said sidewalls of said depression adjoining said insulation spacer.

2. The memory cell configuration according to claim 1, including:

a word line electrically connected to said control gate electrode; and connecting lines running between said two source/drain regions, none of said connecting lines between said two source/drain regions runs parallel to a course of said word line.

3. The memory cell configuration according to claim 1, including insulating structures disposed in said substrate, said depression disposed between two of said insulating structures and said depression having two further sidewalls defined by said insulating structures, and said floating gate electrode likewise adjoins said two further sidewalls.

4. The memory cell configuration according to claim 1, wherein said floating gate electrode does not project out from said depression.

5. The memory cell configuration according to claim 1, wherein each of said two source/drain regions is formed of a first part adjoining one of said two sidewalls of said depression and said channel region, and a second part being doped more heavily than said first part and adjoins said first part.

6. The memory cell configuration according to claim 2, wherein said transistors which are adjacent to one another transversely with respect to said word line are connected in series and form a bit line, two of said transistors which are adjacent to one another transversely with respect to said word line in each case have a common source/drain region.

7. The memory cell configuration according to claim 2, including a bit line, said transistors which are adjacent to one another transversely with respect to said word line are connected in parallel with one another, and one of said source/drain regions in each case is connected to said bit line, and two of said transistors which are adjacent to one another transversely with respect to said word line in each case have a common source/drain region.

8. The memory cell configuration according to claim 1, wherein the memory cell configuration has a periphery containing further transistors disposed in said substrate, said further transistors selected from the group consisting of said planar transistors and planar high-voltage transistors.

9. A method for fabricating an electrically programmable memory cell configuration, which comprises the steps of:

providing a substrate;

producing a depression having a bottom and sidewalls in the substrate;

applying a first dielectric disposed at least partially at the bottom of the depression, the first dielectric dimensioned with a thickness allowing tunneling during programming;

producing a channel region of a planar transistor of a memory cell in the substrate, the channel region adjoining the first dielectric;

forming two source/drain regions of the planar transistor by implantation of a surface of the substrate such that the two source/drain regions adjoin two mutually opposite sidewalls of the depression and extend from the surface of the substrate to the bottom of the depression and that a cross section through the channel region being parallel to the surface of the substrate, intersects the two source/drain regions;

providing an insulation spacer extending along the sidewalls of the depression from the surface of the substrate to the bottom of the depression to the two mutually opposite sidewalls of the depression;

providing the first dielectric layer extending from the insulation spacer of at least one of the sidewalls to the other of the sidewalls on the bottom of the depression;

applying a conductive layer to the depression resulting in the depression being constricted, but not filled, by the conductive layer;

patterning the conductive layer thus forming a floating gate electrode of the planar transistor, the floating gate electrode adjoining the first dielectric and the insulation spacer, the insulation spacer preventing a formation of a capacitance between the floating gate electrode and the two source/drain regions, and the insulation spacer dimensioned with a thickness eliminating tunneling during programming;

forming a second dielectric above the floating gate electrode; and forming a control gate electrode above the second dielectric.

10. The method according to claim 9, which comprises:

producing a connecting line between the two source/drain regions; and producing a word line such that it is electrically connected to the control gate electrode and that the connecting line between the two source/drain regions is not parallel to a course of the word line.

11. The method according to claim 9, which comprise:

producing first insulating structures in the substrate;

forming the depression between two of the first insulating structures, the first insulating structures forming two of the sidewalls of the depression; and patterning the floating gate electrode such that it also adjoins the first insulating structures and thus at least four of the sidewalls of the depression.

12. The method according to claim 9, which comprises:

after the conductive layer has been applied, depositing a planarization material and planarizing the planarization material until parts of the conductive layer situated outside the depression are uncovered; and planarizing parts of the conductive layer situated outside of the depression until the parts are removed, the floating gate electrode which does not project out from the depression thereby being produced.

13. The method according to claim 10, which comprises:

producing a first part of each of the two source/drain regions, the first part adjoins one of the two mutually opposite sidewalls of the depression and the channel region;

after the word line has been produced, depositing and etching back a material for producing spacers along sidewalls of the word line; and producing a second part of each of the two source/drain regions by implantation with an aid of the spacers being used as a mask, the second part being doped more heavily than the first part and adjoins the first part.

14. The method according to claim 10, which comprises:

forming the planar transistor as one of a plurality of planar transistors produced in a plurality of depressions, each two of the planar transistors which are adjacent to one another transversely with respect to the word line share a common source/drain region; and forming a bit line by series-connecting the planar transistors which are adjacent to one another transversely with respect to the word line.

15. The method according to claim 10, which comprises:

forming the planar transistor as one of a plurality of transistors produced in a plurality of depressions, each two of the planar transistors which are adjacent to one another transversely with respect to the word line share a common source/drain region; and producing a bit line connected to a respective source/drain regions of each of the planar transistors which are adjacent to one another transversely with respect to the word line.

16. The method according to claim 11, which comprises:

producing at least one second insulating structure of a further planar transistor of a periphery of the memory cell configuration and a third insulating structure of a planar high-voltage transistor of the periphery in the substrate together with the first insulating structures;

before the control gate electrode is produced, producing a gate dielectric of the further planar transistor of the periphery and a gate dielectric of the planar high-voltage transistor of the periphery;

applying and patterning a further layer thereby producing the control gate electrode which is part of a word line, a gate electrode of the further planar transistor of the periphery and a gate electrode of the planar high-voltage transistor of the periphery;

forming first parts of the two source/drain regions of the planar transistor of the memory cell, first parts of source/drain regions of the further planar transistor of the periphery, and first parts of source/drain regions of the planar high-voltage transistor of the periphery by implantation, the word line, the gate electrode of the further planar transistor of the periphery and the gate electrode of the planar high-voltage transistor of the periphery acting as masks;

depositing and etching back a material for producing spacers along sidewalls of the word line;

forming further spacers on sidewalls of the gate electrode of the further planar transistor of the periphery; and producing second parts of the two source/drain regions of the planar transistor of the memory cell, second parts of the source/drain regions of the further planar transistor of the periphery and second parts of the source/drain regions of the planar high-voltage transistor of the periphery, where at least the spacers and the further spacers act as a mask.

17. The memory cell configuration according to claim 5, including:

a word line disposed within said depression and having a portion extending above said surface of said substrate;

a spacer adjoining said portion of said word line and covering a portion of said substrate; and said first part of said source/drain regions extending below said portion of said surface of said substrate and said second part of said source/drain regions adjoining said portion of said surface of said substrate.

* * * * *